(12) United States Patent
Matsudo et al.

(10) Patent No.: US 7,075,218 B2
(45) Date of Patent: Jul. 11, 2006

(54) TUNING FORK TYPE CRYSTAL COMPONENT FOR ANGULAR VELOCITY SENSOR AND MANUFACTURING METHOD THEREOF

(75) Inventors: Hideryo Matsudo, Saitama (JP); Shigeto Yotuya, Saitama (JP); Jun Katase, Saitama (JP); Takahiro Ohtsuka, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/959,930

(22) Filed: Oct. 6, 2004

(65) Prior Publication Data
US 2005/0122006 A1 Jun. 9, 2005

(30) Foreign Application Priority Data
Oct. 10, 2003 (JP) ............................. 2003-351910
Mar. 24, 2004 (JP) ............................. 2004-087735

(51) Int. Cl.
*H01L 41/08* (2006.01)
(52) U.S. Cl. ..................................... 310/370
(58) Field of Classification Search ............... 310/370
See application file for complete search history.

(56) References Cited

U.S. PATENT DOCUMENTS 5,325,574 A * 7/1994 Takagi et al. ............... 29/25.35
5,607,236 A * 3/1997 Takagi et al. ............... 374/117
6,806,797 B1 * 10/2004 Kikushima .................. 333/200

* cited by examiner

*Primary Examiner*—Mark Budd
(74) *Attorney, Agent, or Firm*—Scott D. Wofsy; Edwards Angell Palmer & Dodge LLP

(57) ABSTRACT

The present invention provides an angular velocity sensor element that can be produced easily with a high degree of accuracy, and a manufacturing method thereof. In the angular velocity sensor element of the present invention, the lengthwise direction of a tuning fork shaped crystal element is a Y axis of a crystal axis, the widthwise direction is an X axis and the depthwise direction is a Z axis, and mutually electrically separated first and second sensor electrodes for angular velocity detection are provided on at least one face among side faces of the tuning fork arm. The tuning fork shaped crystal element is formed from a single crystal wafer by a photo-etching technique, and the side face of the tuning fork arm on which the first and second sensor electrodes are formed is a +X face of the crystal, and the first and second sensor electrodes are arranged on both sides of a protrusion ridge line section on the +X face that occurs in the lengthwise direction of the side face due to crystallinity of the crystal.

4 Claims, 6 Drawing Sheets

TUNING FORK TYPE CRYSTAL COMPONENT FOR ANGULAR VELOCITY SENSOR AND MANUFACTURING METHOD THEREOF

BACKGROUND OF THE INVENTION

The present invention relates to a tuning fork type crystal component for an angular velocity sensor (hereinafter referred to as an "angular velocity sensor element") and a manufacturing method thereof, and in particular, to a sensor electrode of the angular velocity sensor element.

Angular velocity sensor elements are generally known which detect electric charge generated in an arm of a tuning fork by so-called Coriolis force when the tuning fork is vibrating. Moreover, angular velocity sensor elements are used for example in vehicle guidance systems, and devices for preventing camera shake, and mass production thereof is advancing.

FIGS. 6A and 6B are drawings describing a conventional example of an angular velocity sensor element, FIG. 6A showing an angular sensor element, and FIG. 6B showing a connection drawing thereof.

As shown in FIG. 6A, this angular velocity sensor element comprises a Z-cut tuning fork shaped crystal element 10 having a pair of tuning fork arms 1a and 1b that extend from a tuning fork base portion 2. Driving electrodes 3a, 3b, and 4a, 4b, which excite tuning fork vibration, are formed on both principal planes and on the inside and outside side faces of one tuning fork arm 1a respectively. The driving electrodes 3a and 3b on the both principal planes and the driving electrodes 4a and 4b on the inside and outside side faces are commonly connected via respective wiring patterns (not shown in the drawing). In this conventional example, the driving electrodes of the inside and outside side faces are made a reference potential.

Moreover, a pair of sensor electrodes that detect electric charge caused by the Coriolis force, are formed on the inside and outside side faces of the other tuning fork arm 1b. As shown in FIG. 6A and FIG. 6B, the pair of sensor electrodes comprises a ground electrode 5 on the inside side face, and electrically separated first and second sensor electrodes 6a and 6b provided on left and right sides of the outside side face. Furthermore, an electric charge generated with inverse sign to the ground electrode 5 in the tuning fork arm 1b, by the bending that occurs in the orthogonal direction to the plate face (principal plane of the tuning fork shaped crystal element 10) due to the Coriolis force, is detected by the first and second sensor electrodes 6a and 6b.

In particular for the first and second sensor electrodes 6a and 6b which are provided on the outside side face, the area and position need to be formed with a required degree of accuracy. If accuracy of these is not maintained, this can cause a deterioration in uniformity of angular velocity detection sensitivity for the target object, and may also cause generation of unnecessary signals other than the signal originating from the angular velocity.

Also, monitor electrodes 7a and 7b are formed on both principal planes of the other tuning fork arm 1b, for detecting the electric charge due to the amplitude of the tuning fork vibration, to control the amplitude of the tuning fork vibration. In FIG. 6B, reference symbols D1 and D2 denote drive terminals, reference symbols S1 and S2 denote sensor terminals, and reference symbols M1 and M2 denote monitor terminals.

The electrodes are formed for example by setting a mechanically processed individual tuning fork shaped crystal element 10 in a plating frame (not shown in the drawing), and placing this in a vapor deposition apparatus, and then depositing a metallic film on the required places of the crystal element 10. Alternatively, a number of fork shaped crystal elements 10 are integrally formed on a single crystal wafer using a photo-etching technique.

This photo-etching technique generally comprises a photolithography technique (photo-print technique) and a wet etching technique. For example, when forming the tuning fork shaped crystal element 10, a tuning fork shaped hydrofluoric acid resisting mask is formed on the single crystal wafer, and it is immersed in hydrofluoric acid type etchant to remove unwanted parts. Also, when forming the electrodes, a positive or negative photo-resist film (hereinafter referred to as "resist film") is applied on the metallic film provided on the tuning fork shaped crystal element 10, and selective exposure and development are performed, after which unwanted parts of the metallic film are removed by etching to form each electrode pattern (photolithography technique).

However, in the conventional angular velocity sensor element constructed as described above, forming the electrodes with a plating frame and by deposition depends on mechanical accuracy of the plating frame itself and the framing operation. As a result, naturally there has been a limitation for forming electrodes with a high degree of accuracy, for both principal planes and each side face, particularly including the first and second sensor electrodes 6a and 6b on the outside side face of the other tuning fork arm 1b. When miniaturization of the element is attempted, this problem becomes greater.

Also, when forming the first and second sensor electrodes 6a and 6b on the side face of the tuning fork shaped crystal element 10 using a photo-etching technique, a formation method may be performed in which a single crystal wafer on which the tuning fork shaped crystal element 10 is already formed is exposed from an oblique direction. However, when this method is employed, the exposure equipment becomes larger, and there is an issue in that technical problems and may arise due to the oblique exposure.

SUMMARY OF THE INVENTION

An objective of the present invention is to provide an angular velocity sensor element that can be produced easily with a high degree of accuracy, and a manufacturing method thereof.

The present invention focuses attention on a peak shaped protrusion that naturally occurs on a side face corresponding to a +X face of a tuning fork shaped crystal element (tuning fork arm) by etching, due to the etching anisotropy of the crystal, and actively utilizes this peak shaped protrusion to form the first and second sensor electrodes.

The angular velocity sensor element of the present invention is a tuning fork type crystal component for an angular velocity sensor comprising: a tuning fork shaped crystal element having a pair of tuning fork arms extending from a tuning fork base portion where an X axis of a crystal axis (XYZ) is a widthwise direction, a Y axis is a lengthwise direction and a depthwise direction is a Z axis; and mutually electrically separated first and second sensor electrodes for angular velocity detection formed on at least one face among side faces of the tuning fork arms, wherein the tuning fork shaped crystal element is formed by a photo-etching technique, and the first and second sensor electrodes are a +X face among the side faces of the tuning fork arms, and are arranged on both sides of a protrusion ridge line section that occurs in a lengthwise direction of the +X face. Specifically, the construction is such that a division region of the first and second sensor electrodes is provided on the protrusion ridge line portion, and the first and second sensor electrodes are arranged on both sides thereof.

Moreover, a manufacturing method of an angular velocity sensor element according to the present invention is a manufacturing method of a tuning fork type crystal component for an angular velocity sensor comprising: a tuning fork shaped crystal element having a pair of tuning fork arms extending from a tuning fork base portion where an X axis of a crystal axis (XYZ) is a widthwise direction, a Y axis is a lengthwise direction and a depthwise direction is a Z axis; and mutually electrically separated first and second sensor electrodes for angular velocity detection formed on at least one face among side faces of said tuning fork arms; wherein the manufacturing method comprises: an outline processing step for forming on a single crystal wafer by a photo-etching technique a number of the tuning fork shaped crystal elements having protrusion ridge line sections that have remained in the lengthwise direction of +X faces of the crystal after etching, due to etching anisotropy; an electrode material formation step for forming a metallic film on each side face, including both principal planes and the +X face of the tuning fork shaped crystal element of the single crystal wafer; and an electrode dividing step for dividing the metallic film of the +X face along the protrusion ridge line section, and forming the first and second sensor electrodes.

In the angular velocity sensor element of the present invention, the first and second sensor electrodes are formed on both sides of the protrusion ridge line section that occurs on the +X face among the side faces of the tuning fork shaped crystal element (tuning fork arm). As a result, after the metallic film is formed on the entire side face (+X face) of the tuning fork shaped crystal element, the first and second sensor electrodes can be easily obtained if the metallic film section on the protrusion ridge line section is removed and divided by photo-etching, or a laser technique and the like.

In this case, the side face corresponding to the +X face of the tuning fork is an inclined surface towards the protrusion ridge line from the principal plane of the tuning fork. That is, when viewing the tuning fork wafer from the top face, this inclined surface and the protrusion can be seen. Therefore, in either case of carrying out division using a photo-etching technique or using a laser technique (irradiation), exposure or laser irradiation to the single crystal wafer can be done from the perpendicular direction, so that an increase in the size and complexity of the equipment used can be avoided.

Here, when only side face division is performed, this objective can be achieved even if exposure or laser irradiation is performed from one principal plane of the wafer. In this case, the man-hours can be shortened and the equipment simplified. Of course, exposure or laser irradiation may be performed from both faces of the wafer. This case is preferable since a division line centering on the protrusion ridge line part can be formed. Also, the exposure area and laser irradiation area ratio of the front side and the back side of the wafer may be adjusted with the protrusion ridge line portion as the border. Thus, it becomes possible to adjust unnecessary output and the like.

Moreover, since the formation of the electrodes in the present invention basically employs a photo-etching technique (photolithography), the position and area of the electrodes formed on the principal planes and the side faces, including the first and second sensor electrodes, can be controlled with a high degree of accuracy. Although there is a similar advantage in the case of using laser irradiation, particularly in the case of using the photo-etching technique, the advantage is even greater.

Furthermore, concomitantly, since both sides of the protrusion ridge line section on which the first and second sensor electrodes are formed are inclined faces, the electrode area can be made greater and detection sensitivity can be improved compared to the case of a horizontal surface. These effects become more significant as miniaturization of the crystal oscillator progresses.

A manufacturing method of the angular velocity sensor element of the present invention comprises: the steps of an outline processing for forming on the single crystal wafer by a photo-etching technique a tuning fork shaped crystal element having a protrusion ridge line section that has remained in the lengthwise direction of the +X face of the crystal after etching, due to etching anisotropy; an electrode material formation for forming a metallic film to be processed as electrodes, on the tuning fork shaped crystal element of the single crystal wafer; and an electrode dividing for dividing the metallic film along the protrusion ridge line section, and forming the first and second sensor electrodes. As a result, the angular velocity sensor element can be produced.

DETAILED DESCRIPTION OF THE PREFERRED EMBODIMENTS

As a best mode for implementing an angular velocity sensor element of the present embodiment, first and second sensor electrodes are formed by dividing a portion corresponding to a protrusion ridge line section of a metallic film provided on a +X face of a tuning fork shaped crystal element, along the protrusion ridge line section. As a result, the angular velocity sensor element of the present invention can be constructed, with formation of the first and second sensor electrodes made easy.

First of all, the angular velocity sensor element of the present invention is constructed by performing division of the metallic film provided on the +X face for forming the first and second sensor electrodes, with a photo-etching technique or a laser technique. With these techniques, the angular velocity sensor element of the present invention can be easily constructed, ensuring the division of the metal film provided on the +X face.

As a best mode for carrying out the manufacturing method of the angular velocity sensor element of the present invention, here in the electrode dividing step a photo-etching technique is employed, comprising a step for forming a positive or negative type photo-resist film on the metallic film of the +X face, a step for removing the photo-resist film on the protrusion ridge line section by selective exposure and development appropriate to the positive type or negative type resist, and exposing the metallic film portion, and a step for forming the first and second sensor electrodes by wet etching the metallic film portion to divide the metallic film. As a result, the metallic film on the +X face can be reliably divided, and the first and second sensor electrodes obtained.

Furthermore, in the manufacturing method of the angular velocity sensor element of the present invention, the selective exposure is performed from a direction perpendicular to the aforementioned principal plane of the crystal wafer. As a result, compared with the conventional method which uses oblique exposure, the equipment itself that is used can be simplified, and problems caused by the oblique exposure such as difficulty in maintaining accuracy when tilting the wafer stage or light source, or difficulty in designing a photo-mask on the assumption of oblique exposure, can be overcome.

Figure 6A:
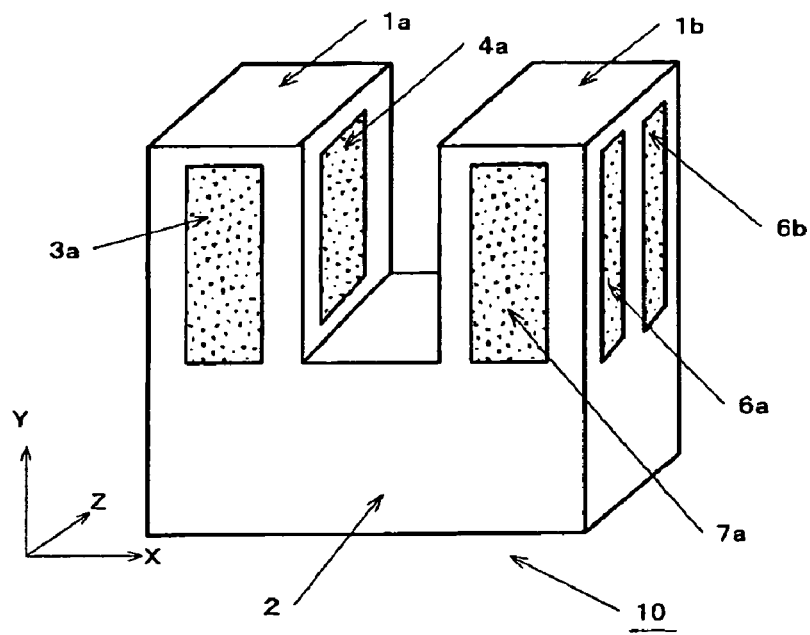
FIG. 6 is a drawing describing an angular velocity sensor element of a conventional example.

Moreover, the metallic film is formed simultaneously on both principal planes and each side face by vapor deposition or sputtering, and the electrodes on the principal planes and the electrodes on the various side faces including the first and second sensor electrodes (for example the electrodes described in FIG. 6A and FIG. 6B denoted by 3a, 3b, 4a, 4b, 5, 6a, 6b, 7a and 7b), are formed integrally by photo-etching. As a result it becomes possible to perform division of the metallic film which forms the first and second sensor electrodes, and formation of the other electrodes on the principal planes and the side faces simultaneously.

Furthermore, the electrode dividing step involves a laser dividing step which removes by laser, the metallic film portion of the metallic film, which is provided on the protrusion ridge line section. As a result, the metallic film on the +X face is reliably divided, and the first and second sensor electrodes are obtained. Here in the method of executing sensor electrode division by laser radiation, equipment cost is comparatively inexpensive compared with the case where this is done by a photo-etching technique.

Moreover, the laser division process is executed after the metal film has been formed on the principal planes and each side face of the tuning fork arms by vapor deposition or sputtering, and the electrodes of the principal planes have been formed by a photo-etching technique. As a result the step for forming the metallic film, and the time for dividing are well defined.

The laser division process is executed after the electrodes have been formed on the principal planes by a photo-etching technique, and after the metal film has been formed on each side face by a lift-off technique. As a result, the electrodes of the principal planes and the side faces can be made from different materials. If the metallic film on the side faces is formed by a lift-off technique, then compared with the case where a metallic film is formed on all sides, and then resist is applied to this and the electrodes are formed by exposing and developing this resist to selectively etch the metallic film, disconnection at the ridge line can be prevented.

Furthermore, the electrodes of both principal planes and the metallic film of each side face are made different materials. As a result, for example the electrodes of the principal planes can be composed of Au (gold) in view of their connecting with the external circuit, while the metallic film of the side faces (electrodes) can be made from Ag (silver) which has a smaller mass than Au. As a result, degradation of crystal-impedance and the like caused by mass loading can be prevented.

Also in the present invention, when formation of the side face electrodes is executed by a lift-off technique, Ag can be used as the electrode material. Therefore compared to the case where Au (gold) is used, a production effect can also be obtained where metallic burrs are unlikely to occur after lift-off. Furthermore, since the etching selection ratio of Au and Ag is easily achieved, it is fully possible to regenerate the side face electrodes if a defect occurs in their formation.

First Embodiment

Figure 1A:
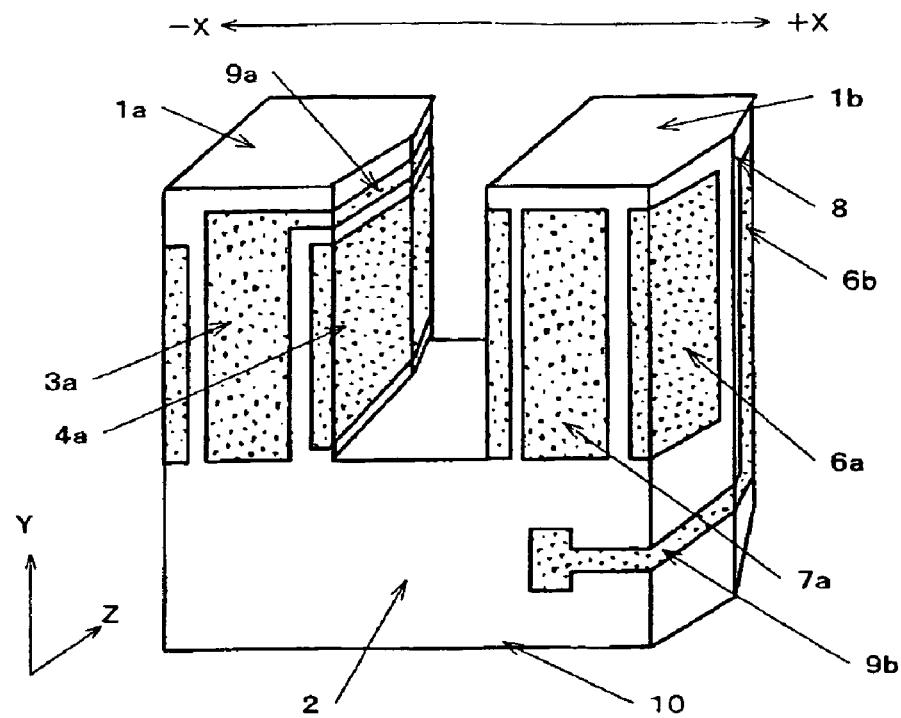
FIG. 1 is a drawing describing an angular velocity sensor element, being a first embodiment of the present invention.
Figure 1B:
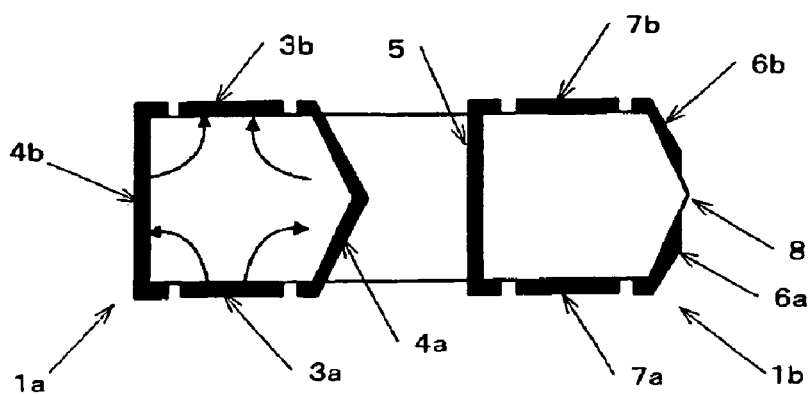

FIG. 1 is a drawing describing one embodiment of an angular velocity sensor element of the present invention, FIG. 1A being a perspective view and FIG. 1B being a plan view of the tuning fork arms viewed from above.

Figure 6B:
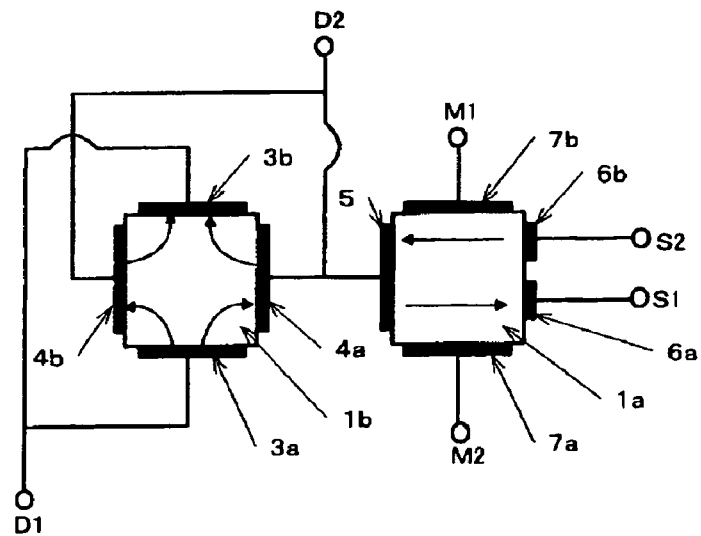

The angular velocity sensor element of the present invention comprises a tuning fork shaped crystal element 10. Driving electrodes 3a, 3b, 4a, and 4b are formed on the front, back, inside and outside side faces of one tuning fork arm 1a extending from a tuning fork base portion 2, and a ground electrode 5 and a pair of first and second sensor electrodes 6a and 6b are formed on the inside and outside side faces of the other tuning fork arm 1b, and monitor electrodes 7a and 7b are formed on both principal planes. The driving electrodes 3a, 3b, 4a, and 4b, the monitor electrodes 7a and 7b, the ground electrode 5, and the sensor electrodes 6a and 6b are connected as shown in FIG. 6B mentioned above.

Moreover, the tuning-fork shaped crystal element 10 is formed from a single plate crystal wafer (not shown in the drawing) by a photo-etching technique, that is, a photolithography technique and a wet etching technique. In this case, due to the etching anisotropy of the crystal, after etching, a peak shaped protrusion, that is, a protrusion ridge line section 8 is formed along the lengthwise direction of the tuning fork arm on the side face corresponding to the +X face of the crystal, among the side faces of each of the tuning fork arms 1a and 1b, and both sides of the ridge line section become inclines.

The right side face when the tuning fork shaped crystal element 10 is seen in an erect state is the +X face of the crystal. Also, the protrusion ridge line section 8 denotes a region having a spread in the widthwise direction of the tuning-fork, and includes part of both the side inclined faces of the protrusion ridge line section 8 that occur on the +X face.

Moreover the electrodes of both principal planes (front and back face) of each tuning fork arm 1a and 1b, and each side face, are formed by a photo-etching technique. Furthermore, here, with the protrusion ridge line section 8 formed on the outside side face of the other tuning fork arm 1b as a dividing region, the first and second sensor electrodes 6a and 6b are formed on the inclined faces on both sides thereof.

In the embodiment shown in FIG. 1A and FIG. 1B, the electrode dividing section is provided centered on the protrusion ridge line section 8 so that both sides thereof become substantially even. However, the electrode dividing section may be formed from the apex of the protrusion ridge line section to only one principal plane side of the tuning fork. In short, the dividing section of the sensor electrodes 6a and 6b only has to be formed by actively using the protrusion occurring on the +X face, and an inclined surface from the protrusion towards the tuning fork principal plane.

Moreover, in this embodiment, driving electrodes 3a provided on the front and back face of the one tuning fork arm 1a are commonly connected with a wiring pattern 9a provided on the inclined face of the +X face. Also, a wiring pattern 9b of a second sensor electrode 6b provided on the other tuning fork arm 1b extends to the front face over the protrusion ridge line section 8 and across the inclined face. Here other wiring patterns are omitted. Of course the connection example shown here is one example, and other connection methods may be used According to such a construction, in the angular velocity sensor element of the present invention, the first and second sensor electrodes 6a and 6b are formed here on the outside face, "+X face", of the other tuning fork arm 1b of the tuning fork shaped crystal element 10, and are arranged on both sides of the protrusion ridge line section. As a result, as is later described in a second and third embodiment, after the metallic film is formed over the whole side face (X face) of the tuning fork shaped crystal element 10, if the metallic film portion on the protrusion ridge line section is removed to divide this, by a photo-etching or laser technique or the like, the first and second sensor electrodes 6a and 6b can be easily obtained.

Moreover, in the angular velocity sensor element of the present invention, the protrusion section and the inclined face formed on the +X face are used. Therefore, particularly when dividing the metallic film using the photo-etching technique or the laser technique (irradiation), exposure or laser irradiation to the single crystal wafer only needs to be executed from the perpendicular direction. As a result, an increase in the size and complexity of the equipment used can be avoided, and simplification is possible.

Also, basically in the present invention, the formation of the electrodes employs a photo-etching technique (photolithography) and laser irradiation technique. Therefore the position and area of the electrodes formed on the principal planes and the side faces, including the first and second sensor electrodes 6a and 6b, can be controlled with a high degree of accuracy.

Furthermore, both sides of the protrusion ridge line section on which the first and second sensor electrodes 6a and 6b are formed are inclined faces. Therefore the electrode area can be made greater and detection sensitivity can be improved compared to the case of a horizontal surface. The effect of this becomes significant as miniaturization of the sensor element progresses.

Moreover, in the first embodiment, the driving electrodes 3a and 3b provided on the front and back face of the one tuning fork arm 1a are commonly connected by the wiring pattern 9a provided on the inclined face of the +X face. Similarly, the wiring pattern 9b of the second sensor electrode 6b provided on the other tuning fork arm 1b also extends across the inclined face to the front face. Consequently, disconnection can be prevented compared to the case where the wiring pattern is provided on a right-angled face.

Second Embodiment

Figure 2A:
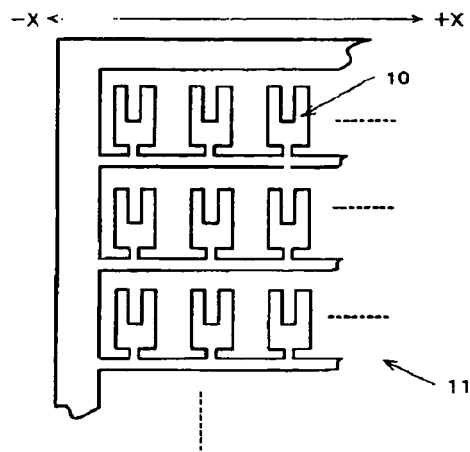
FIG. 2 is a drawing describing a manufacturing method of an angular velocity sensor element, being a second embodiment of the present invention.
Figure 2B:
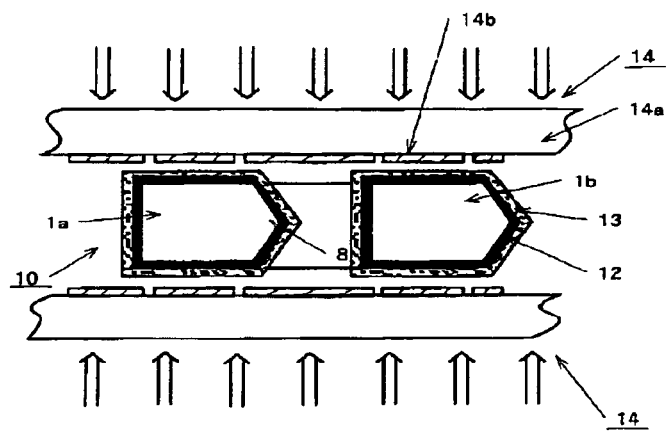
Figure 2C:
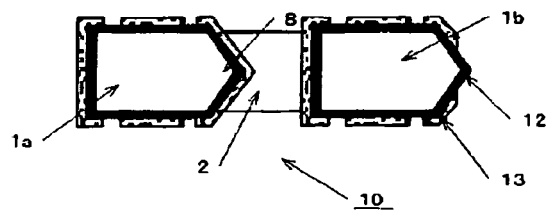

FIG. 2 is a drawing describing a manufacturing method of the angular velocity sensor element of the first embodiment of the present invention, FIG. 2A being a partial plan view of the single crystal wafer, FIG. 2B being a plan view of an angular velocity sensor element showing the exposure condition, and FIG. 2C being a plan view after exposure.

The manufacturing method of an angular velocity sensor element of the present invention comprises, in order of time, an outline processing step, an electrode material forming step, and an electrode dividing step.

First of all, in the outline processing step, a plurality of tuning fork shaped crystal elements 10 are formed on a Z-cut single crystal wafer 11 by a photo-etching technique (photolithography technique and wet etching technique).

In this case, the etching condition is controlled so that the protrusion ridge line section 8 formed along the lengthwise direction due to the etching anisotropy of the crystal as described above, remains and is formed on the +X face, among the side faces of the tuning fork shaped crystal element 10. A number of tuning fork shaped crystal elements 10 are integrated for example by having part of their base bottom faces connected to a frame. Here too, the +X face of the crystal is the right side when viewing the tuning fork shaped crystal elements 10 in the upright condition (see FIG. 2A).

Next, in the electrode material forming step, a metallic film 12 serving as the electrode material is formed on each side face (inside and outside side faces) including both principal planes and the +X face of each tuning fork shaped crystal element 10 formed on the single crystal wafer 11. In the metallic film 12, for example, a first layer (substrate electrode) is Cr, and a second layer is Au. These layers are formed simultaneously on both principal planes and each side face by vapor deposition or sputtering.

Finally, in the electrode division step, the metallic film on the +X face, being the outside side face of the tuning fork shaped crystal element 10, is divided along the protrusion ridge line section 8 to form the first and second sensor electrodes 6a and 6b. This is performed with a photo-etching technique, and the electrodes on each side face, including the principal planes and the +X face, are formed simultaneously.

More specifically, first of all a resist film 13 is formed on the metallic film 12 provided on both principal planes and each side face of the tuning fork shaped crystal element 10. For this resist film 13, both positive type and the negative type resist are acceptable. Here, an example using a positive type resist is shown.

Next, photomasks 14 are arranged on both principal plane sides of the single crystal wafer 11 that has the tuning fork shaped crystal elements 10. In the photomask 14, a light shielding pattern 14b that corresponds to a resist pattern needed for the electrode formation, is formed on a light transmission body 14a such as silica glass. Then, light is irradiated onto the photomasks 14 of both principal planes, from the perpendicular direction (frontal direction) as shown by the arrows (see FIG. 2B).

In this case, it is particularly important to irradiate light to the resist film on the portion on the protrusion ridge line section 8, that corresponds to the dividing region of the first and second sensor electrodes 6a and 6b. As a result, the portions of the resist film 13, that are unnecessary for the electrode pattern including the sensor electrode dividing region of the +X face, are exposed, and the portions that are necessary for forming the electrode pattern are light shielded (so-called "selective exposure").

Next, after being selectively exposed, the single crystal wafer 11 is processed with developer to dissolve the unnecessary parts of the resist film 13. As a result, a resist pattern corresponding to the electrodes on the principal planes and the electrodes on the side faces, including the sensor electrodes 6a and 6b on the +X face, is formed on the metallic film 12. Therefore, the metallic film portion that is not necessary for forming electrodes on the principal planes and on the side faces, including the protrusion ridge line section 8 between the sensor electrodes 6a and 6b on the +X face, can be exposed (see FIG. 2C). The metallic film 12 and the resist film 13 on the tuning fork base portion 2 are omitted in this drawing.

Next, the developed single crystal wafer 11 is immersed in the etchant for the metallic film 12. As a result, the unnecessary electrode film portion is removed, and the electrodes on each side face and the principal planes, including the sensor electrodes 6a and 6b on the +X face formed on both sides of the protrusion ridge line section 8, can be obtained (see FIG. 1B). FIG. 1B shows the condition where the resist film on each electrode has been removed.

According to such a manufacturing method of an angular velocity sensor element of the present invention, as previously mentioned, the first and second sensor electrodes 6a and 6b can easily be formed on the side face, being the outside face of the tuning fork arm 1b, corresponding to the +X face of the crystal. Moreover, in the present invention, since formation of the electrodes employs a photolithography technique, the position and area thereof can basically be controlled with a high degree of accuracy.

More specifically, the position and the area can be controlled with a high degree of accuracy compared to the mechanical type that uses a plating frame and the like, and light only has to be irradiated from the direction perpendicular to the protrusion ridge line section 8, compared to with photo-etching in which light is irradiated from an oblique direction. Therefore the equipment used need not be large, and the aforementioned problem of oblique exposure can be overcome.

Furthermore, in the first embodiment, the driving electrodes 3a and 3b provided on the front and back face of the one tuning fork arm 1a are commonly connected by the wiring pattern 9a provided on the inclined face of the +X face. Similarly, the wiring pattern 9b of the second sensor electrode 6b provided on the other tuning fork arm 1b also extends across the inclined face to the front face. Consequently, disconnection can be prevented compared to the case where the wiring pattern is provided on a right-angled face.

Moreover, the first and second sensor electrodes 6a and 6b are respectively formed on the inclined surfaces on both sides of the protrusion ridge line section 8 of the other tuning fork arm 1b. Consequently, the area of these inclined surfaces is greater than in the case where the side face is a flat surface. Therefore the electrode area can be formed large. As a result, the amount of electric charge due to the Coriolis force that can be detected can be increased, and hence the angular velocity detection sensitivity is improved.

Third Embodiment

Figure 3:
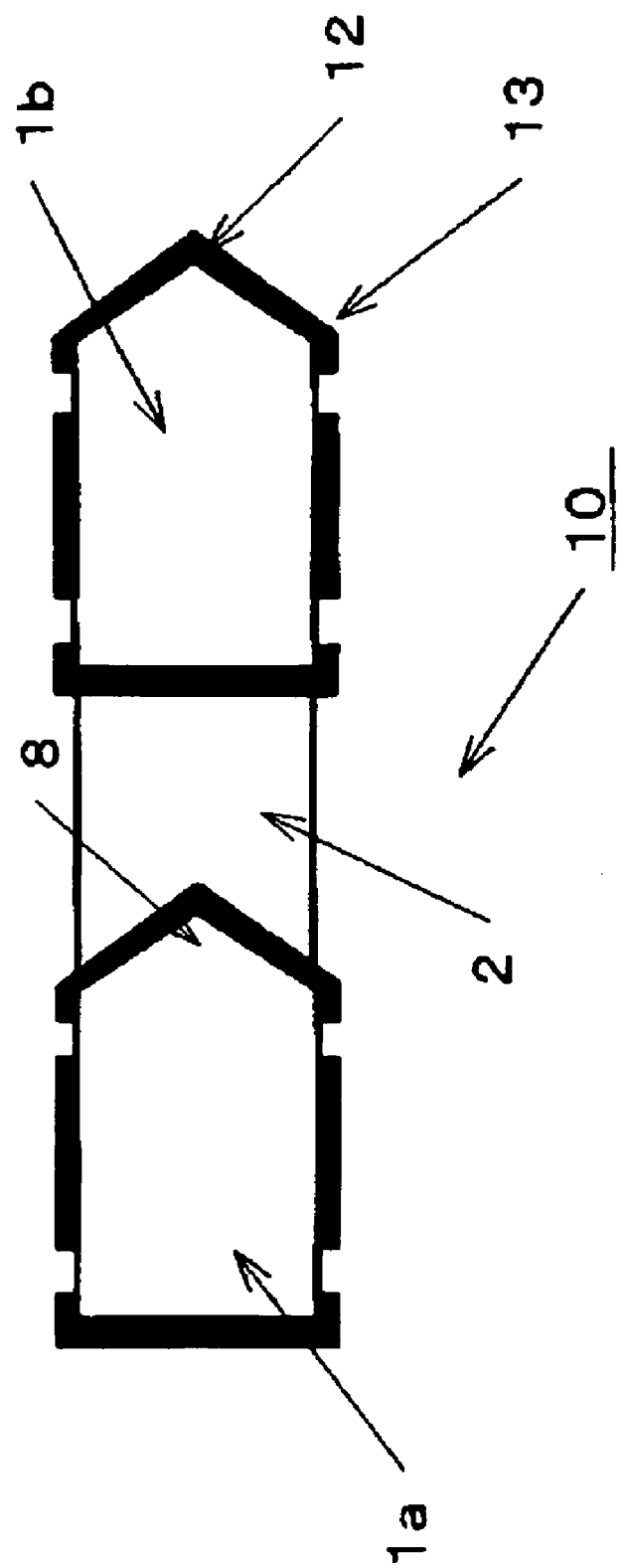
FIG. 3 is a drawing describing a manufacturing method of an angular velocity sensor element, being a third embodiment of the present invention.

FIG. 3 is a drawing describing a third embodiment of a manufacturing method of an angular velocity sensor element of the present invention, being an example of dividing the first and second sensor electrodes using a laser.

As with the first embodiment described above, the third embodiment also comprises an outline processing step, an electrode material forming step, and an electrode dividing step. In the third embodiment, the outline processing step is identical to that of the first embodiment, and the tuning fork shaped crystal element 10 having the protrusion ridge line section 8 on the +X face, among the side faces, is formed on the single crystal wafer 11 by a photo-etching technique (see FIG. 2A).

Next, in the electrode material forming step, similarly to before, the metallic film 12 is formed, having electrode material made of Au and a substrate of Cr, on each side face, including both principal planes and the inside faces, of each of the tuning fork shaped crystal elements 10 (in short, all faces except for the top and bottom faces). Then the metallic film 12 on both principal planes and each side face is processed with a photo-etching technique.

That is to say, in the third embodiment, the electrodes on both principal planes and the electrodes on each side face except for the first and second sensor electrodes 6a and 6b on the outside face "+X face" of the tuning fork arm 1b are formed by a photo-etching technique. In short, the metallic film 12 of the outside face is left remaining over the entire face (see FIG. 3).

Figure 4:
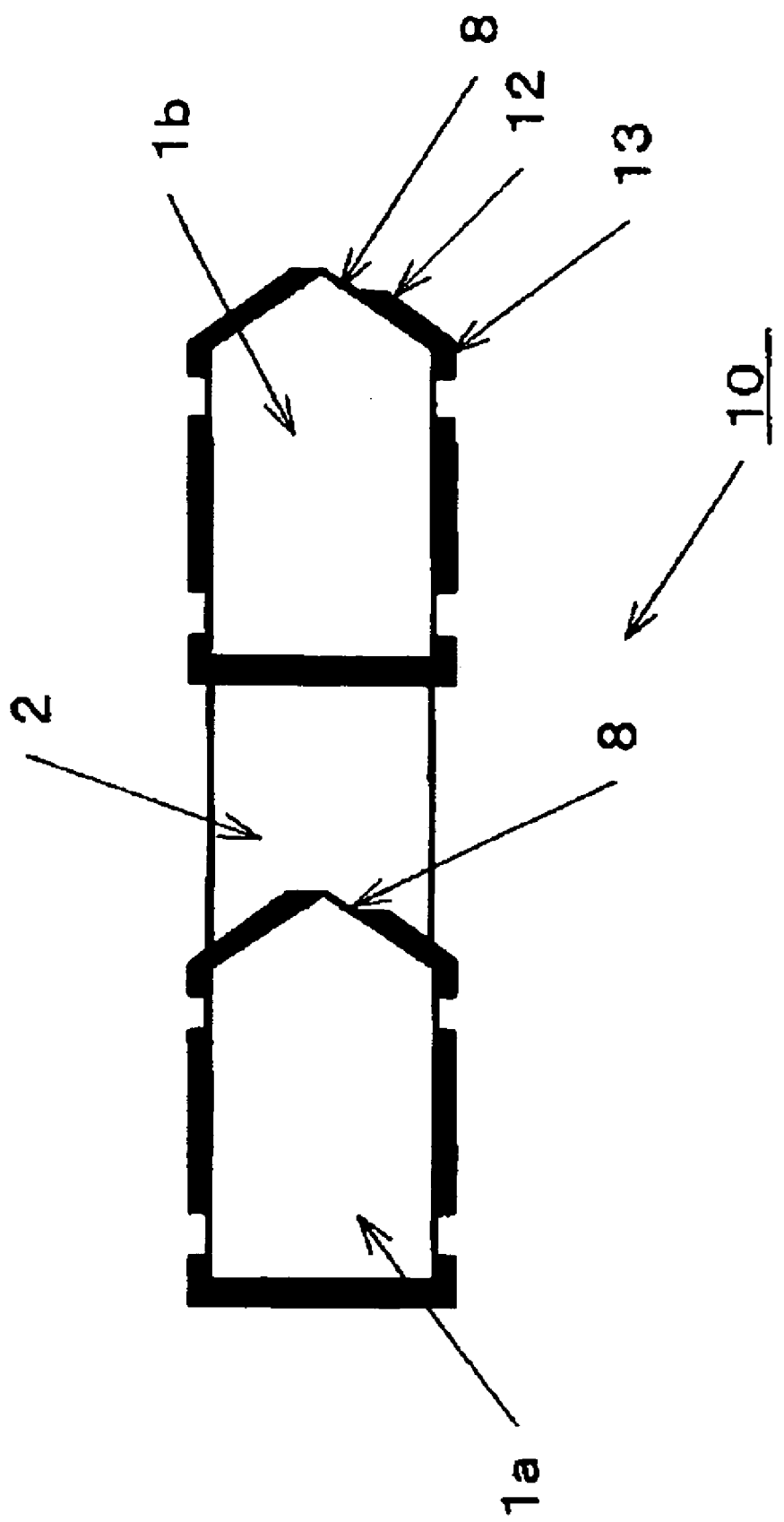
FIG. 4 is a drawing describing a manufacturing method of an angular velocity sensor element, being the third embodiment of the present invention.

Then, the first and second sensor electrodes 6a and 6b are formed on the plate face of each of the tuning fork shaped crystal elements 10 by irradiating a laser from, for example, the perpendicular direction onto the protrusion ridge line section 8 of the outside face "+X face", and removing the metallic film 12 of the protrusion ridge line section 8. As a result, the electrodes can be obtained on the principal planes and each side face (see FIG. 1B). However, as shown in FIG. 4, only the inclined surface on one principal plane side of the protrusion ridge line section 8 is removed Also with such a manufacturing method, an effect similar to that of the first embodiment of the present invention is achieved, and since basically this involves electrode formation using a photolithography technique, the position and area can be controlled with a high degree of accuracy compared to a mechanical type that uses a plating frame. Also, in the case of using a laser, compared to the exposure executed in the first embodiment, irradiation only has to be performed in spots with a laser gun for example. Therefore irradiation not only from the perpendicular direction to the plate face but also from an oblique direction is acceptable.

Figure 5A:
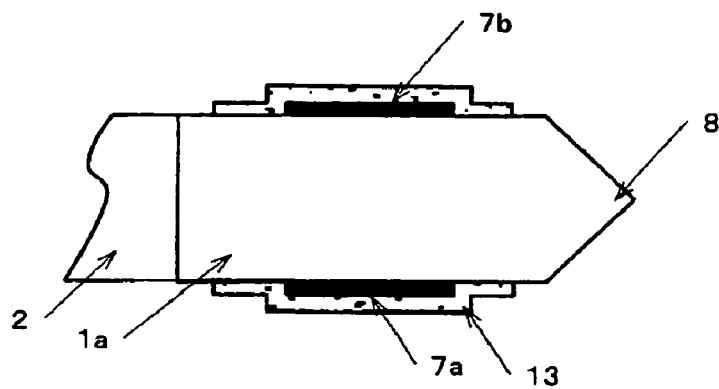
FIG. 5 is a drawing describing a manufacturing method of an angular velocity sensor element, being another specific example of the third embodiment of the present invention.
Figure 5B:
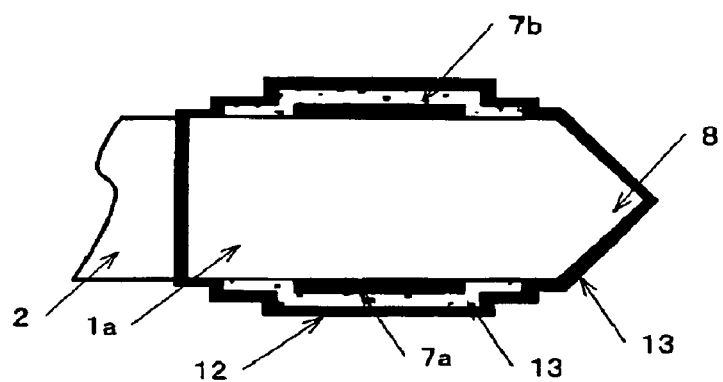
Figure 5C:
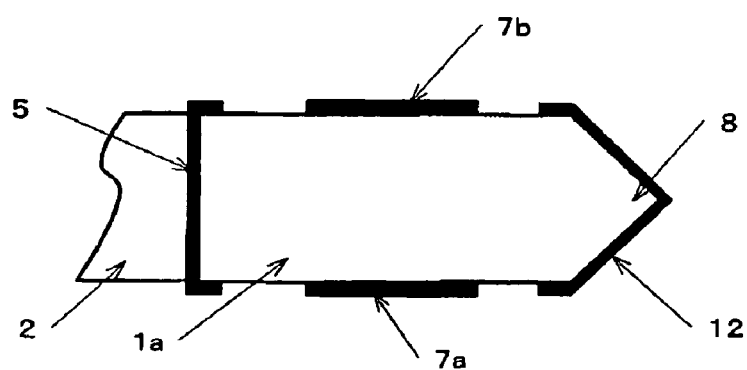

In the third embodiment, the electrode material forming step may be performed as shown in FIG. 5A, FIG. 5B and FIG. 5C differently to the above description. FIG. 5 is a top view of the other tuning fork arm 1b, and is taken as an example for the description. That is to say, in the electrode material forming step here, first of all, a tuning fork shaped metallic film (for example Cr+Au) is formed on the front and back sides of a wafer by a photo-etching technique. This wafer is then immersed in crystal etchant to obtain a wafer that has a large number of tuning fork parts. Next, the metallic film, which has been used as a mask for the crystal etching, is processed with a photo-etching technique to form the electrodes 3a, 3b, 7a, and 7b on the principal planes of the tuning fork. Here, an example of the right arm only, that is, an example with monitor electrodes 7a and 7b formed is shown (see FIG. 5A). Next, the resist pattern 13 is formed so that the resist remains in the region apart from the region in which the side face electrodes will be formed.

Next the metallic film 12 is formed on all faces including both principal planes and each side face (see also FIG. 5B). Then, the metallic film 12 is provided on each side face by a so-called lift-off technique, in which the metallic film 12 on the principal planes of the tuning fork is removed by chemically releasing the resist film 13 (see FIG. 5C). The metallic film on the inside face becomes a ground electrode 5 as is. Moreover, similarly to as described above, the first and second sensor electrodes 6a and 6b can be formed by irradiating a laser onto the protrusion ridge line section 8 (see FIG. 1B).

In this case, an effect similar to that mentioned above can be achieved, and the metallic film 12 on the side faces can be separately selected from the metal on the principal planes. Here, by selecting silver for example, the dividing operation by means of lift-off or laser is facilitated. That is to say, since silver is less malleable than gold, an effect can also be achieved in that hair-like metal shavings are not produced, and the cleaning process becomes unnecessary. Furthermore, the equipment can be simplified and man-hours reduced since Ag can be removed with a lower energy laser compared to Au.

In the embodiments described above the first and second sensor electrodes 6a and 6b are provided on the outside face of the other tuning fork arm 1b. However, they may be provided on the inside face of the one tuning fork arm 1a. In this case, the driving electrode 4 becomes on the other tuning fork arm 1b. Moreover the driving electrode 4 is formed on the one tuning fork arm 1a, and the sensor electrodes 6a and 6b are formed on the other tuning fork arm 1b. However they may be provided on both +X faces of the pair of tuning fork arms 1a and 1b depending on the driving method and the like. However, providing the sensor electrodes 6a and 6b on the other tuning fork arm 1b and making the one tuning fork arm 1a a dedicated arm for tuning fork vibration enables electrode positioning to be simple. Moreover, problems of the tuning fork drive signal influencing the sensor electrodes 6a and 6b via capacitive coupling between the driving electrode and the sensor electrode can be easily reduced.

What is claimed is:

1. A tuning fork type crystal component for an angular velocity sensor comprising: a tuning fork shaped crystal element having a pair of tuning fork arms extending from a tuning fork base portion where an X axis of a crystal axis (XYZ) is a widthwise direction, a Y axis is a lengthwise direction and a Z axis is a depthwise direction; and mutually electrically separated first and second sensor electrodes for angular velocity detection formed on at least one face among side faces of said tuning fork arms; wherein said tuning fork shaped crystal element is formed by a photo-etching technique, and said first and second sensor electrodes are formed on a +X face among the side faces of said tuning fork arms, and are arranged on both sides of a protrusion ridge line section formed in a lengthwise direction of said +X face due to crystallinity of said crystal.

2. A tuning fork type crystal component for an angular velocity sensor according to claim 1, wherein said first and second sensor electrodes are formed by dividing along said protrusion ridge line section, a portion of a metallic film provided on said +X face of said tuning fork shaped crystal element, corresponding to an apex of said protrusion ridge line section.

3. A tuning fork type crystal component for an angular velocity sensor according to claim 2, wherein said dividing is performed by a photo-etching technique.

4. A tuning fork type crystal component for an angular velocity sensor according to claim 2, wherein said dividing is performed by a laser technique.

* * * * *